United States Patent
Wang et al.

(10) Patent No.: US 9,275,924 B2
(45) Date of Patent: Mar. 1, 2016

(54) SEMICONDUCTOR PACKAGE HAVING A RECESS FILLED WITH A MOLDING COMPOUND

(75) Inventors: Tsung-Ding Wang, Tainan (TW); Jung Wei Cheng, Hsinchu (TW); Bo-I Lee, Sindian (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

(21) Appl. No.: 13/585,500

(22) Filed: Aug. 14, 2012

(65) Prior Publication Data

US 2014/0048926 A1 Feb. 20, 2014

(51) Int. Cl.
| H01L 23/48 | (2006.01) |
| H01L 23/52 | (2006.01) |
| H01L 29/40 | (2006.01) |
| H01L 23/31 | (2006.01) |
| H01L 23/00 | (2006.01) |
| H01L 21/00 | (2006.01) |

(52) U.S. Cl.
CPC ............ *H01L 23/3185* (2013.01); *H01L 24/13* (2013.01); *H01L 23/3114* (2013.01); *H01L 23/3192* (2013.01)

(58) Field of Classification Search
USPC ........... 257/737, 738, 779, 780, 781; 438/462
See application file for complete search history.

(56) References Cited

U.S. PATENT DOCUMENTS

| 6,107,164 | A | 8/2000 | Ohuchi |
| 6,338,980 | B1 | 1/2002 | Satoh |
| 6,607,970 | B1 | 8/2003 | Wakabayashi |
| 2005/0148160 | A1* | 7/2005 | Farnworth et al. ............ 438/462 |
| 2006/0079025 | A1 | 4/2006 | Kripesh et al. |
| 2008/0054461 | A1* | 3/2008 | Lang et al. .................... 257/738 |
| 2009/0011543 | A1* | 1/2009 | Karta et al. .................... 438/114 |
| 2009/0243097 | A1* | 10/2009 | Koroku et al. ................ 257/737 |
| 2010/0273312 | A1* | 10/2010 | Noda ............................ 438/462 |

* cited by examiner

*Primary Examiner* — Mamadou Diallo
*Assistant Examiner* — Jay C Chang
(74) *Attorney, Agent, or Firm* — Hauptman Ham, LLP

(57) ABSTRACT

A semiconductor package includes a passivation layer overlying a semiconductor substrate, a bump overlying the passivation layer, and a molding compound layer overlying the passivation layer and covering a lower portion of the bump. A sidewall of the passivation layer is covered by the molding compound layer.

19 Claims, 9 Drawing Sheets

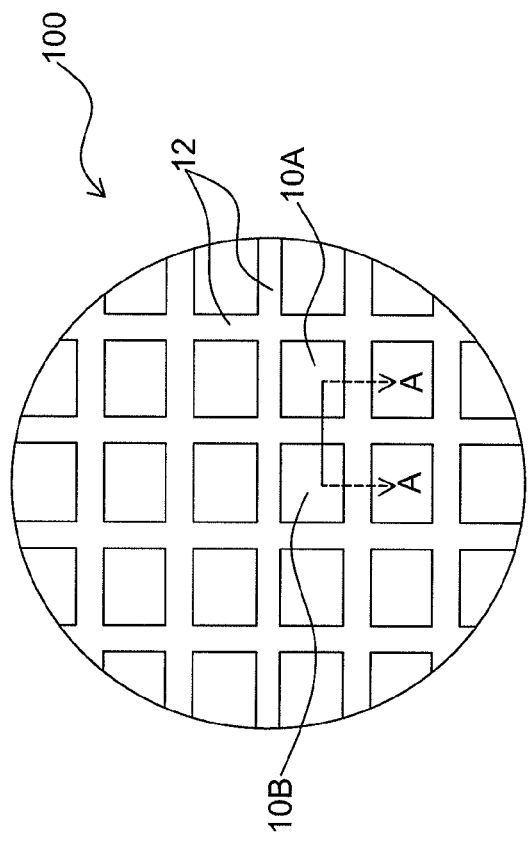
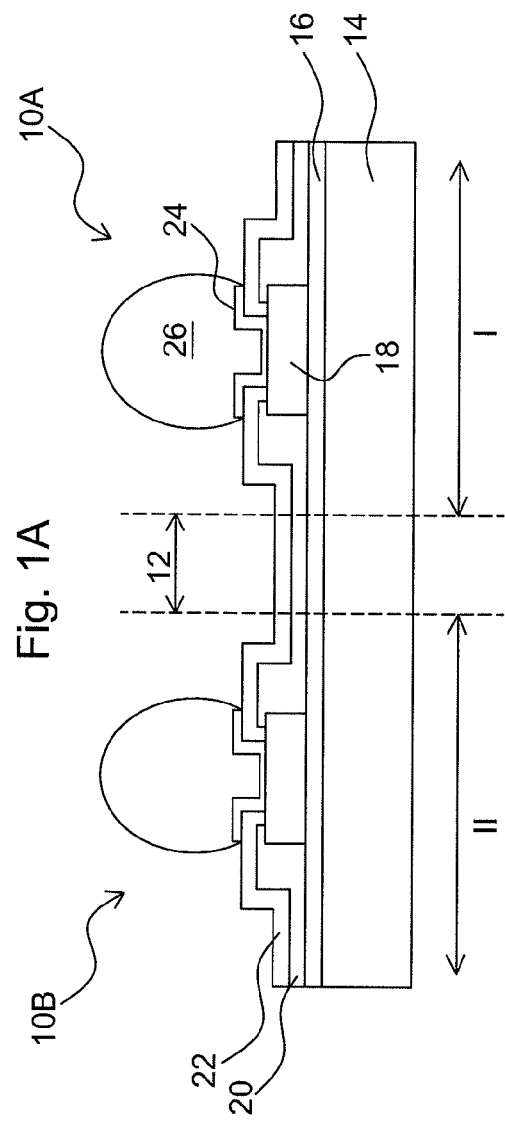
Fig. 1A
Fig. 1B

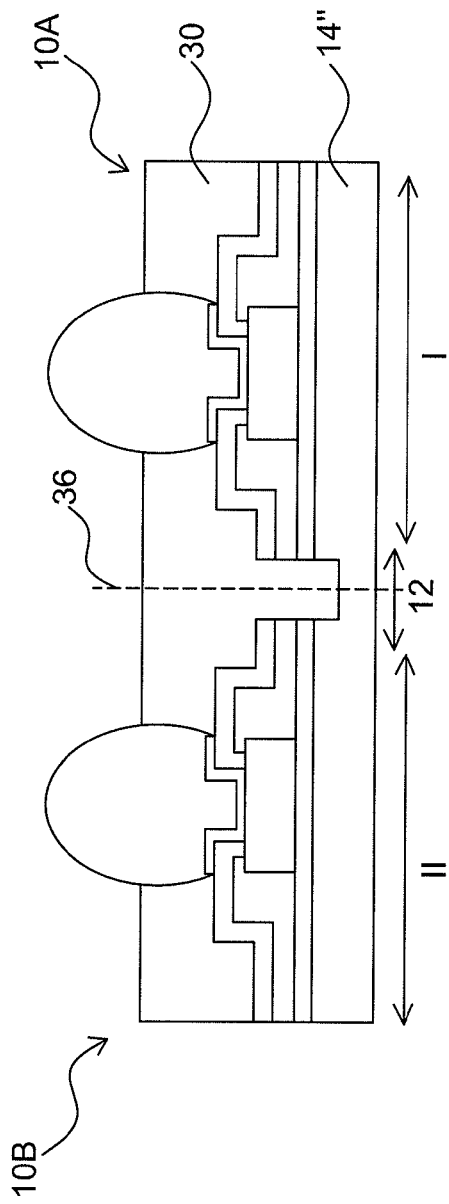
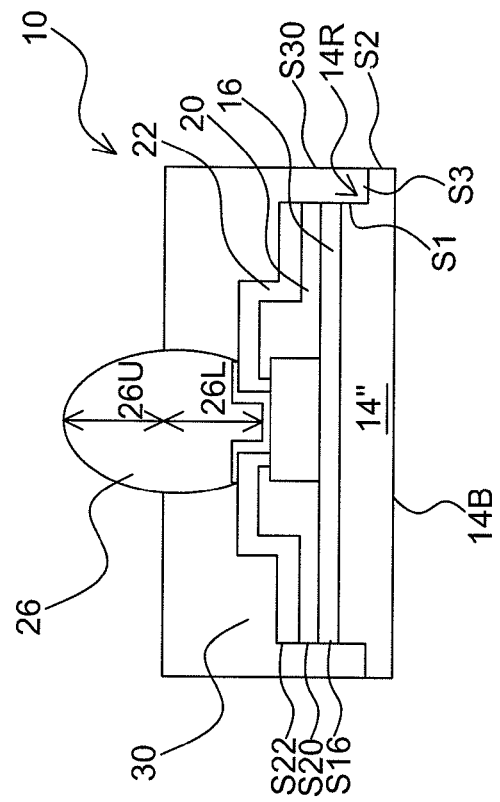
Fig. 5
Fig. 6

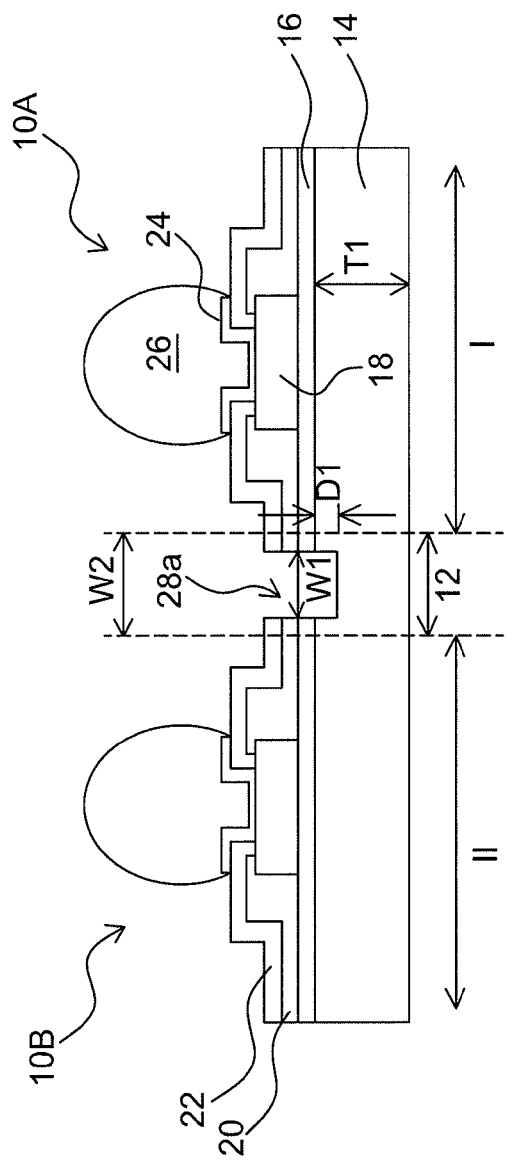
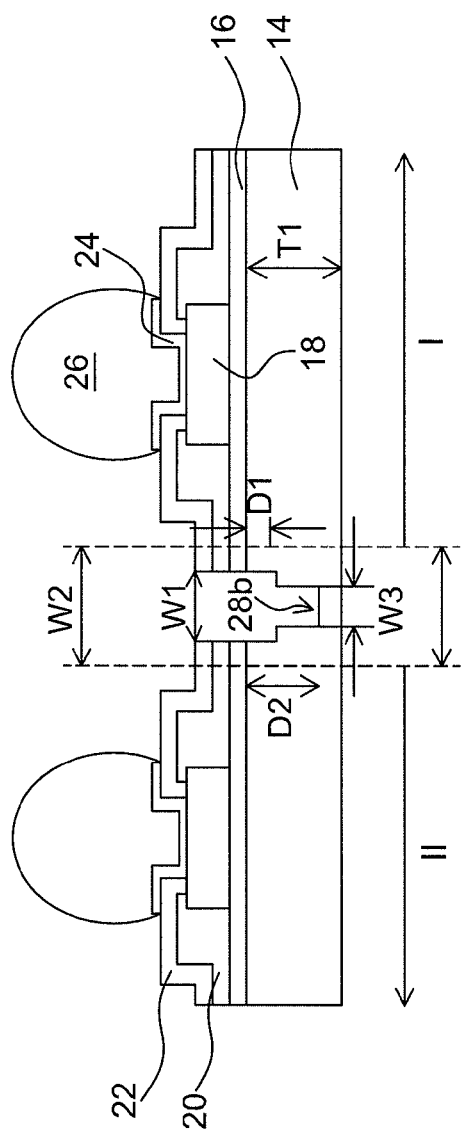

SEMICONDUCTOR PACKAGE HAVING A RECESS FILLED WITH A MOLDING COMPOUND

TECHNICAL FIELD

The disclosure relates to semiconductor packages and, more particularly, to methods of manufacturing semiconductor packages.

BACKGROUND

Modern integrated circuits are made of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump structure usually refers to a bump and an "under bump metallurgy" (UBM) located between the bump and an I/O pad. Wafer level chip scale packaging (WLCSP) is currently widely used for its low cost and relatively simple processes, and ball placement or ball drop process is utilized in the WLCSP technology.

DESCRIPTION OF THE DRAWINGS

FIGS. 1A-1B, 2A-2B and 3-6 are schematic diagrams illustrating a method of manufacturing a semiconductor package according to an embodiment;

FIGS. 7-12 are schematic diagrams illustrating a method of manufacturing a semiconductor package according to an embodiment.

DETAILED DESCRIPTION

Figure 2A:
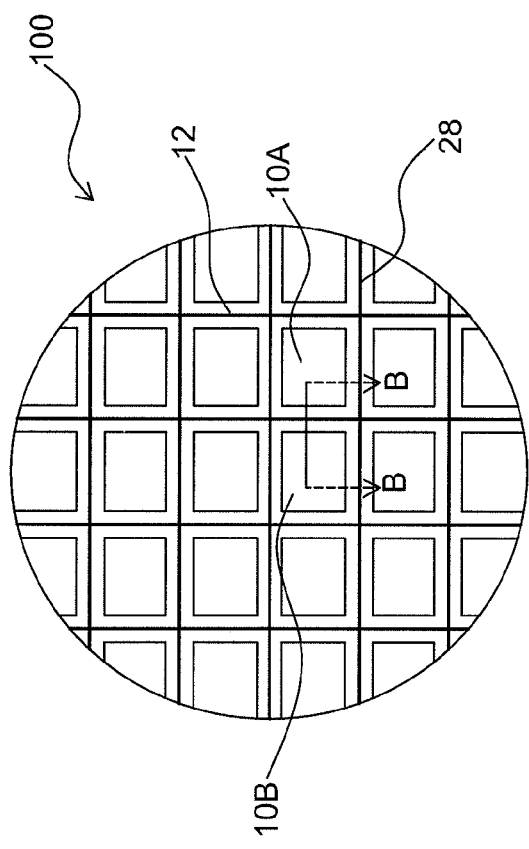

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Embodiments described herein relate to bumps for use with semiconductor devices. As will be discussed below, embodiments are disclosed that utilize a bump for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1A-1B, 2A-2B and 3-6 are schematic diagrams illustrating a method of manufacturing a semiconductor package according to an embodiment.

With reference to FIG. 1A and FIG. 1B, a semiconductor wafer 100 including a plurality of chips (or dies) 10A and 10B with electrical circuitry and bumps manufactured thereon is provided. FIG. 1A is a top view of the semiconductor wafer 100 with chips 10A and 10B according to an embodiment, and FIG. 1B is a cross-sectional view taken along the line A-A shown in FIG. 1A. The semiconductor wafer 100 comprises an array of chips separated from each other by two sets of intersecting scribe line regions 12. One set of scribe line regions 12 extend along a first direction and a second set of scribe line regions 12 extend along a second direction. In accordance with an embodiment, the chips 10A and 10B have a substantially identical structure. The cross-section view illustrates a first chip 10A formed on a first chip region I and a second chip 10B formed a second chip region II, and the chip regions I and II are separated by the scribe line region 12. The structures of the chips 10A and 10B formed on the chips regions I and II are described in detail below.

In manufacturing the chips 10A and 10B, semiconductor processes are performed on a semiconductor substrate 14 to form an electrical circuitry, a dielectric layer 16, contact pads 18, a first passivation layer 20, a second passivation layer 22, under-bump metallization (UBM) layers 24 and bumps 26. In an at least one embodiment, the layers 16, 20, and 22 are also formed to extend onto the scribe line region 12. The semiconductor substrate 14 may include, for example, bulk silicon, doped or undoped, or an active layer of a semiconductor-on-insulator (SOI) substrate. Other substrates, such as a multi-layered or gradient substrate may also be used. The electrical circuitry (not shown) formed in the semiconductor substrate 14 may be any type of circuitry suitable for a particular application. In some embodiments, the electrical circuitry includes electrical devices having one or more dielectric layers overlying the electrical devices. Metal layers may be formed between dielectric layers to route electrical signals between the electrical devices. Electrical devices may also be formed in one or more dielectric layers. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The dielectric layer 16 may be formed, for example, of a low dielectric constant (low-K) dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the dielectric layer 16 may comprise a plurality of layers of dielectric materials. Metal lines and/or vias (not shown) may be formed inside the dielectric layer 16 to provide an electrical connection to the electrical circuitry formed in the semiconductor substrate 14. In some embodiments, the uppermost dielectric layer is formed of a dielectric material, such as silicon nitride, silicon oxide, undoped silicon glass, and the like.

The contact pads 18 are formed on the dielectric layer 16 to electrically connect the metal lines or vias inside the dielectric layer 16. In some embodiments, the contact pads 18 may be formed of aluminum, aluminum copper, aluminum alloys, copper, copper alloys, or the like. One or more passivation layers, such as the first passivation layer 20 and the second passivation layer 22, are formed over the dielectric layer 16 and patterned to expose portions of the contact pads 18 respectively. In some embodiments, the first passivation layer 20 is formed of a dielectric material, such as undoped silicate glass (USG), silicon nitride, silicon oxide, silicon oxynitride or a non-porous material by any suitable method, such as CVD, PVD, or the like. In an embodiment, the first passivation layer 20 is formed to cover a peripheral portion of each contact pad 18, and to expose a central portion of each contact pad 18 through openings in the first passivation layer 20. The first passivation layer 20 may be a single layer or a laminated layer. The second passivation layer 22 is formed over the first passivation layer 20 and patterned to expose portions of the contact pads 18 respectively. In some embodiments, the second passivation layer 22 may be, for example, a polymer layer, which is patterned to form openings, through which the contact pads 18 are exposed. In some embodiments, the polymer layer is formed of a polymer material such as an epoxy, polyimide, benzocyclobutene (BCB), polybenzoxazole (PBO), or the like, although other relatively soft, often organic, dielectric materials can also be used. The formation methods include spin coating or other methods.

The UBM layers 24 are formed on the exposed portions of the corresponding contact pads 18. In some embodiments, the UBM layer 24 extends to a surface of the second passivation layer 22 adjacent to the contact pad 18. The formation methods of the UBM layer 24 include photoresist coating, lithography, wet or dry etching, and/or the like. In an embodiment, the UBM layer 24 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM layer 24 includes at least one Ti-containing layer and at least one Cu-containing layer.

The bumps 26 are formed on the corresponding UBM layers 24. The bump 26 can be a spherical bump or a pillar bump formed of a conductive material including at least one of solder, Cu, Ni or Au. In an embodiment, the bump 26 is a solder bump formed by attaching a solder ball to the UBM layer 24 and then thermally reflowing the solder material. In an embodiment, the solder bump is formed by plating a solder layer using photolithography technologies followed by reflow processes. In an embodiment, the solder bump has a diameter greater than about 200 µm. In some embodiments, the solder bump includes a lead-free pre-solder layer, SnAg, or a solder material including alloys of tin, lead, silver, copper, nickel, bismuth, or combinations thereof.

Figure 2B:
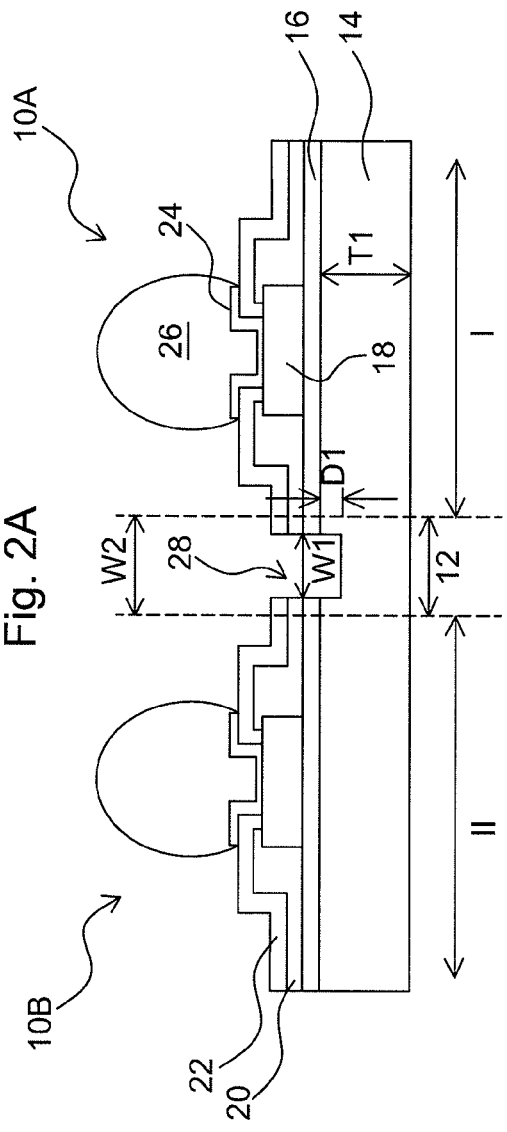

With reference to FIG. 2A and FIG. 2B, a grooving process is performed on the wafer 100 to form grooves 28 on the scribe line regions 12. FIG. 2A is a top view of the semiconductor wafer 100 with the grooves 28 according to an embodiment, and FIG. 2B is a cross-sectional view taken along the line B-B shown in FIG. 2A. The grooving process removes portions of the second passivation layer 22, the first passivation layer 20, the dielectric layer 16 and the semiconductor substrate 14 within the scribe line regions 12. In an embodiment, the grooves 28 are formed by irradiating the scribe line regions 12 are with a laser beam. The grooves 28 on the wafer 100 can be formed in a continuous manner on the scribe line regions 12 according to one embodiment, such that the planar layout of the groove 28 is substantially similar to that of the intersecting scribe line regions 12. For example, first sets of grooves 28 extend along the first direction and second sets of grooves extend along the second direction. In some embodiments, the grooves 28 on the wafer 100 can be formed in a discontinuous manner in the scribe line regions 12 and separated from each other by a distance. As a result, at least one groove 28 is formed on the scribe line region 12 between two adjacent chip regions I and II. In an embodiment, the groove 28 of a width W1 penetrates the layers 22, 20 and 16 and reaches to a depth D1 of the semiconductor substrate 14. The depth D1 is less than a thickness T1 of the semiconductor substrate 14, and the width W1 is less than a width W2 of the scribe line region 12. In an embodiment, the depth D1 is equal to or greater than about 10 µm.

Figure 3:
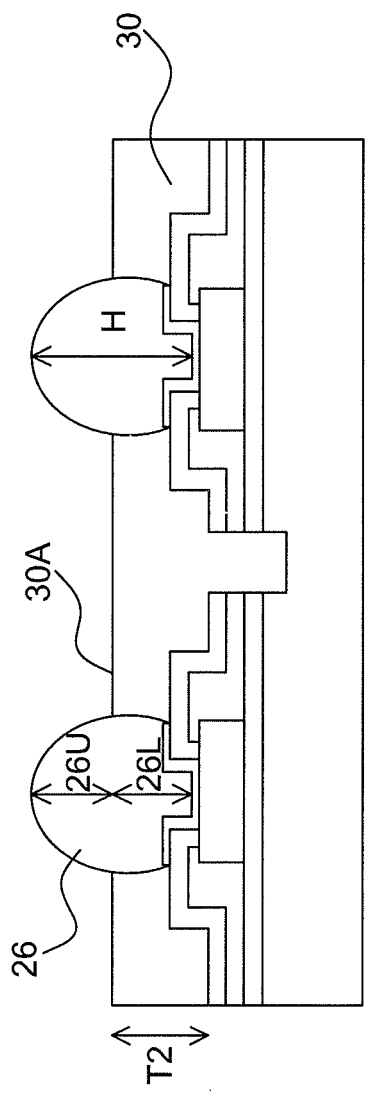

Next, as shown in FIG. 3, a molding compound layer 30 is applied on the structure depicted in FIG. 2B to cover the second passivation layer 22 and fill the grooves 28, where each bump 26 is partially buried in the molding compound layer 30. In an embodiment, the bump 26 including the lower portion 26L and the upper portion 26U, and the molding compound layer 30 is in physical contact with a lower portion 26L of the bump 26, while the upper portion 26U of the bump 26 is exposed and protrudes from a top surface 30A of the molding compound layer 30. In some embodiments, the molding compound layer 30 may be in physical contact with the second passivation layer 22 and/or the UBM layers 24. In some embodiments, the thickness (T2) of the molding compound layer 30 is between about ¼ to ¾ of the height (H) of the bump 26. In an embodiment, the molding compound layer 30 is formed by applying a liquid molding compound and performing a curing process to cure and solidify the liquid molding compound. In some embodiments, a release film or a soft material may be applied on the liquid molding compound. Pressure is applied on the release film on the liquid molding compound, so that a portion of the bump 26 is pressed into the release film. Furthermore, the pressure applied on the release film may push some of liquid molding compound downward. While the pressure is applied to the release film pushing against the bump and the liquid molding compound, a curing may be performed to cure and solidify liquid molding compound. Thereafter, the release film is peeled off the molding compound layer 30.

Figure 4:
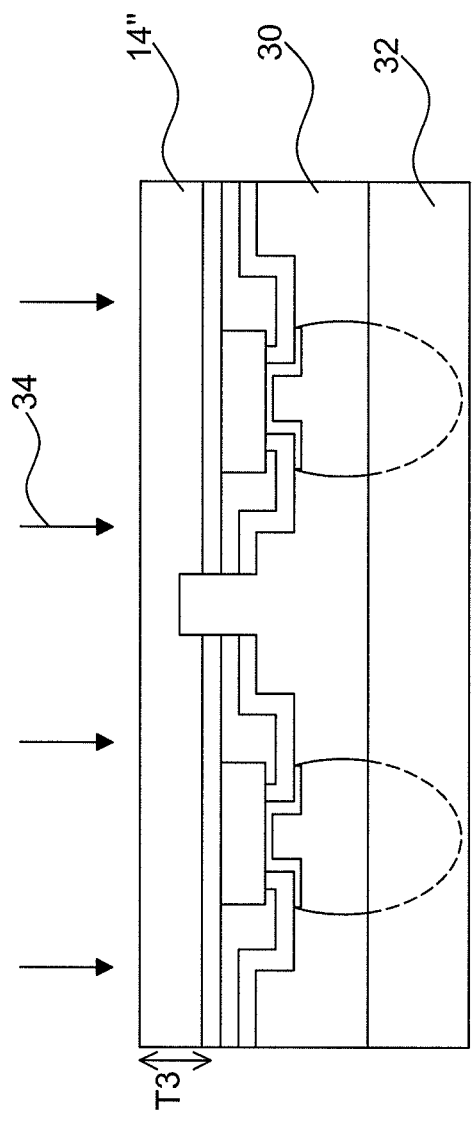

Then, as shown in FIG. 4, the wafer 100 is positioned upside down and attached to a tape 32, followed by performing a grinding process 34 on the backside of the semiconductor substrate 14, so as to thin down the thickness of the semiconductor substrate 14. In an embodiment, the thinned substrate 14" has a thickness T3 which is less than the thickness T1, but greater than the depth D1 of the groove 28.

After detaching the tape 32 as depicted in FIG. 5, a singulation process is performed on the scribe line regions 12 to separate the individual chips 10 from the wafer 100. As depicted in FIG. 5, the dotted line 36 indicates the singulation process performed on the scribe line region 12, which passes through the molding compound layer 30 within the groove 28 and passes through the semiconductor substrate 14 underlying the groove 28. After the singulation process, an example individual chip 10 is shown as FIG. 6. The molding compound layer 30 covers the lower portion 26L of the bump 26, the surface of the second passivation layer 22, and the sidewalls S22, S20 and S16 of the layers 22, 20 and 16. In addition, in the individual chip 10, the thinned substrate 14" includes an upper sidewall S1 adjacent to the sidewall S16 of the dielectric layer 16, a lower sidewall S2 adjacent to the backside 14B of the thinned substrate 14", and a surface region S3 extending from the upper sidewall S1 to the lower sidewall S2. The upper sidewall S1 and the surface region S3 are parts of the groove 28 created by the grooving process, resulting in a recess region 14R at the edge of the thinned substrate 14". The lower sidewall S2 is formed by the singulation process.

In an embodiment, the upper sidewall S1 is substantially leveled with at least one of the sidewalls S16, S20 and S22 of the layers 16, 20 and 22, and the lower sidewall S2 is substantially leveled with the sidewall S30 of the molding compound layer 30. In an embodiment, the upper sidewall S1 has the depth substantially the same as the depth D1. In an embodiment, the molding compound layer 30 covers the upper sidewall S1 and the surface region S3 of the thinned substrate 14". In an embodiment, the molding compound layer 30 fills the recess region 14R of the thinned substrate 14". The individual chips 10 may be used in many different situations. For example, the individual chip 10 may be used in a die-to-die bonding configuration, a die-to-wafer bonding configuration, die-level packaging, or the like. In some embodiments, the individual chip 10 is flipped upside down and attached to another substrate, for example, a chip, an interposer, a printed circuit board (PCB), or any other package substrates.

According to the embodiments depicted in FIG. 6, the molding compound layer 30 fully covers the upper sidewall S1 and surface region S2 of the semiconductor substrate 14 adjacent to the chip edge to provide the bump 26 with a strong adhesive strength so as to eliminate the chip crack issue during the singulation process. Also the molding compound layer 30 covers the lower portion 26L of the bump 26, which can provide a strong package structure for attaching to another substrate. Moreover, using laser grooving process prior to the chip singulation process can eliminate or reduce the initial crack points in the dielectric layer 16, the passivation layers 20 and 22 and the edge of the chip 10 so that the device reliability is improved.

FIGS. 7~12 are schematic diagrams illustrating a method of manufacturing a semiconductor package according to an embodiment. Unless specified otherwise, the reference numerals in these embodiments represent like elements in the embodiments illustrated in FIGS. 1-6.

With reference to FIG. 7, a first grooving process is performed on the wafer 100 to form a first groove 28a on the scribe line region 12. The first grooving process removes portions of the second passivation layer 22, the first passivation layer 20, the dielectric layer 16 and the semiconductor substrate 14 within the scribe line regions 12. In an embodiment, the first groove 28a of a width W1 penetrates the layers 22, 20 and 16 and reaches to a depth D1 of the semiconductor substrate 14. The depth D1 is less than the thickness T1 of the semiconductor substrate 14, and the width W1 is less than the width W2 of the scribe line region 12. In an embodiment, the depth D1 is equal to or greater than about 10 μm.

Next, as shown in FIG. 8, a second grooving process is performed on the wafer 100 to form a second groove 28b inside the first groove 28a on the scribe line region 12. The first grooving process removes portions of the semiconductor substrate 14 underlying the first groove 28a. In an embodiment, the second groove 28b of a width W3 penetrates the semiconductor substrate 14 and reaches to a depth D2 of the semiconductor substrate 14. In some embodiments, the depth D2 satisfies the formula: D1<D2<T1, and the width W3 satisfies the formula: W3<W1<W2.

Figure 9:
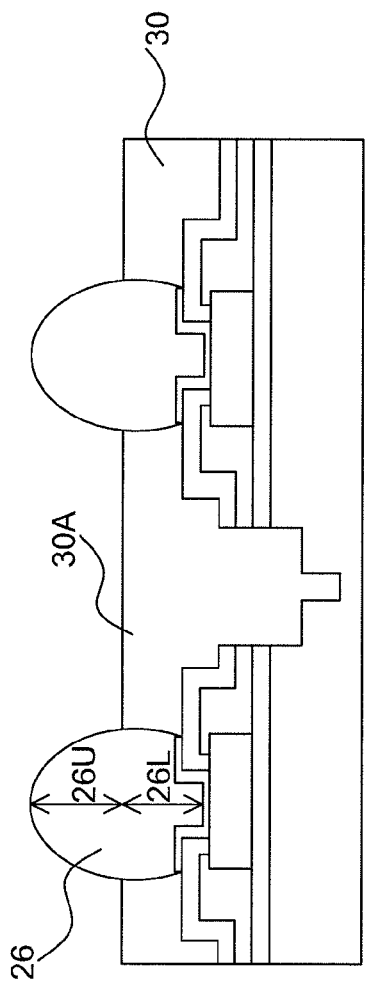

Next, as shown in FIG. 9, a molding compound layer 30 is applied on the resulting structure depicted in FIG. 8 to cover the second passivation layer 22 and fill the grooves 28a and 28b, where each bump 26 is partially buried in the molding compound layer 30. In an embodiment, the molding compound layer 30 is in physical contact with a lower portion 26L of the bump 26, while the upper portion 26U of the bump 26 is exposed and protrudes from a top surface 30A of the molding compound layer 30. In some embodiments, the molding compound layer 30 may be in physical contact with the second passivation layer 22 and/or the UBM layers 24.

Figure 10:
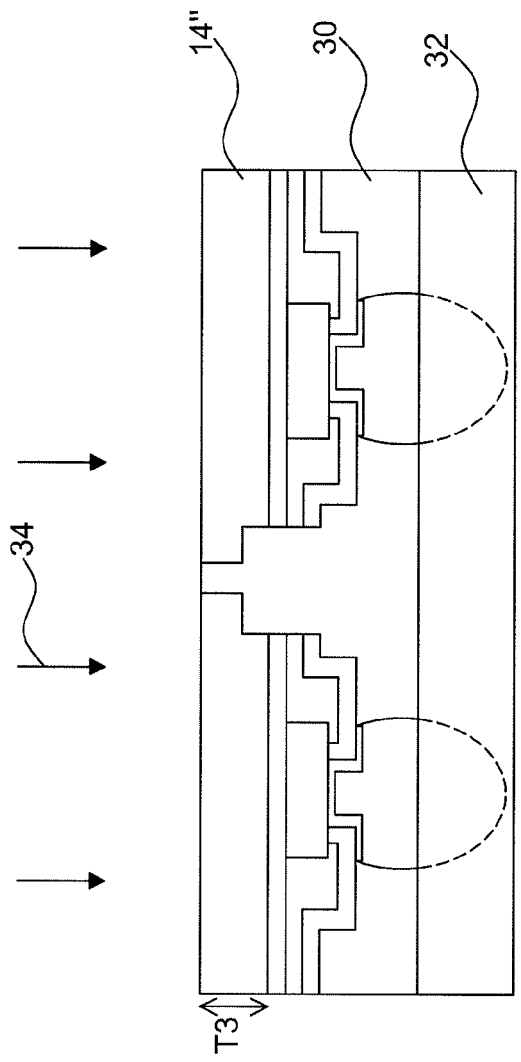
Figure 11:
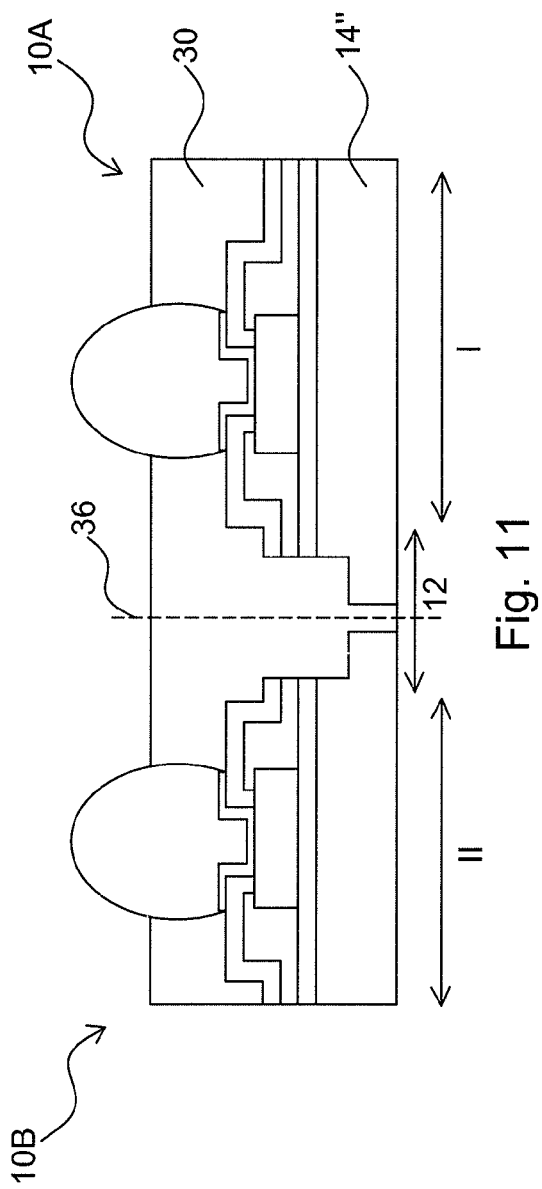

Then, as shown in FIG. 10, the wafer 100 is positioned upside down and attached to a tape 32, followed by performing a grinding process 34 on the backside of the semiconductor substrate 14, so as to thin down the thickness of the semiconductor substrate 14. The thinned substrate 14" has a thickness T3 which is less than the thickness T1. In an embodiment, the thickness T3 is substantially equal to the depth D3 of the second groove 28b, such that the molding compound layer 30 is exposed on the backside of the thinned substrate 14". In some embodiments, the thickness T3 is greater than the depth D3 of the second groove 28b. After detaching the tape 32, a singulation process is performed on the scribe line regions 12 to separate the individual chips 10 from the wafer 100. As depicted in FIG. 11, the dotted line 36 indicates the singulation process performed on the scribe line region 12, which passes through the molding compound layer 30 within the grooves 28a and 28b and passes through the semiconductor substrate 14 underlying the groove 28b.

Figure 12:
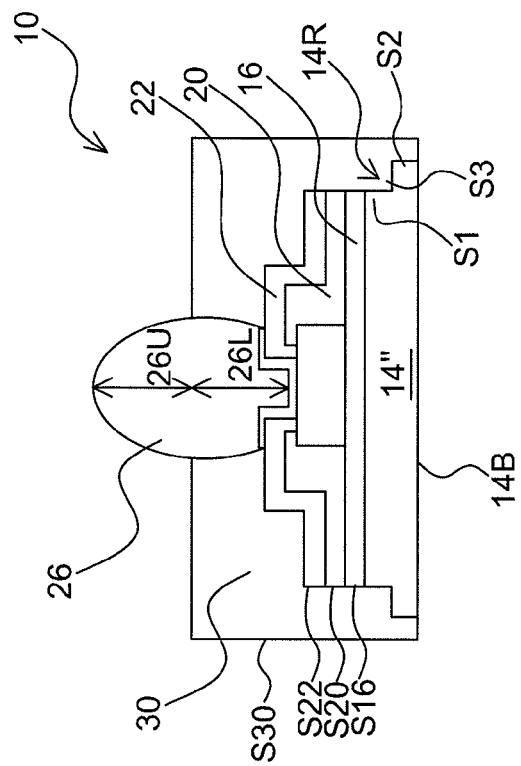

After the singulation process, the individual chip 10 is shown as FIG. 12. The molding compound layer 30 covers the lower portion 26L of the bump 26, the surface of the second passivation layer 22, and the sidewalls S22, S20 and S16 of the layers 22, 20 and 16. In addition, in the individual chip 10, the thinned substrate 14" includes an upper sidewall S1 adjacent to the sidewall S16 of the dielectric layer 16, a lower sidewall S2 adjacent to the backside 14B of the thinned substrate 14", and a surface region S3 extending from the upper sidewall S1 to the lower sidewall S2. The upper sidewall S1 and the surface region S3 are parts of the first groove 28a created by the first grooving process, resulting in a recess region 14R at the edge of the thinned substrate 14". The lower sidewall S2 is parts of the second groove 28b created by the second grooving process. In an embodiment, the molding compound layer 30 covers the upper sidewall S1, the surface region S3 and the lower sidewall S2 of the thinned substrate 14". In an embodiment, the molding compound layer 30 covers and fills the recess region 14R of the thinned substrate 14".

Figure 13:
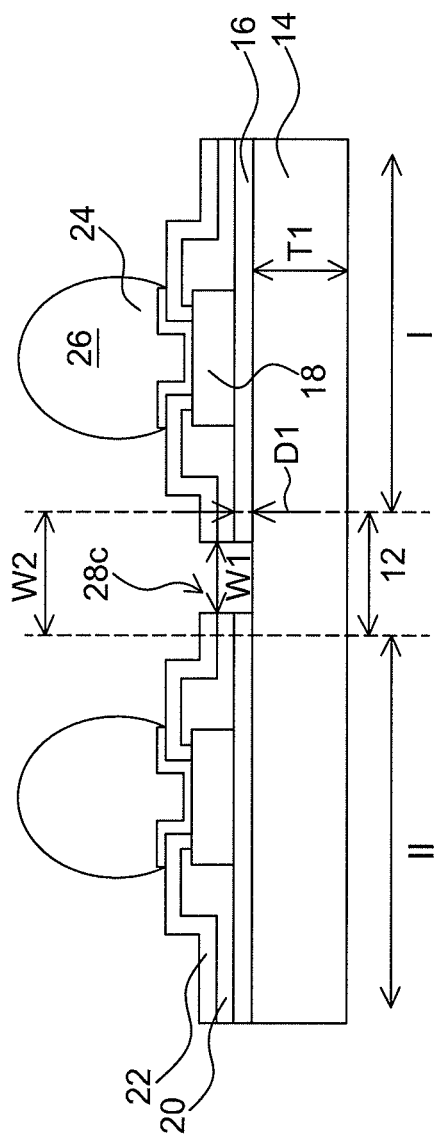
FIGS. 13-15 are schematic diagrams illustrating a method of manufacturing a semiconductor package according to an embodiment.
Figure 14:
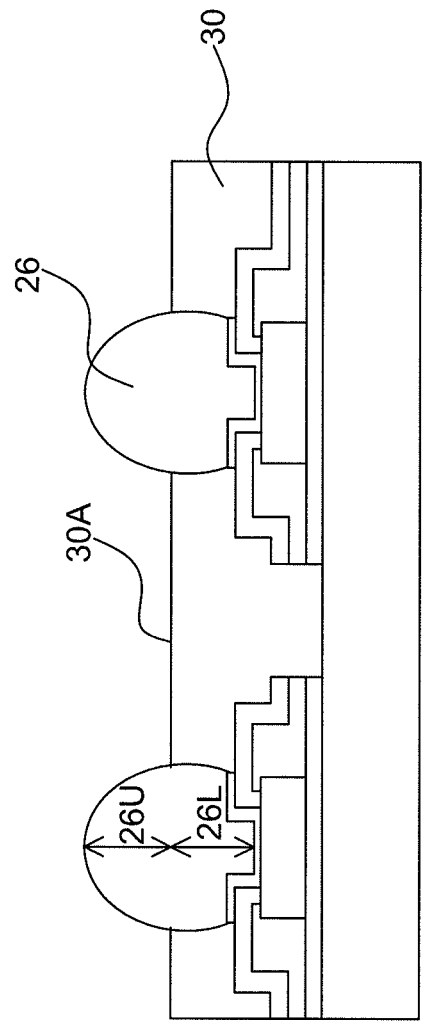
Figure 15:
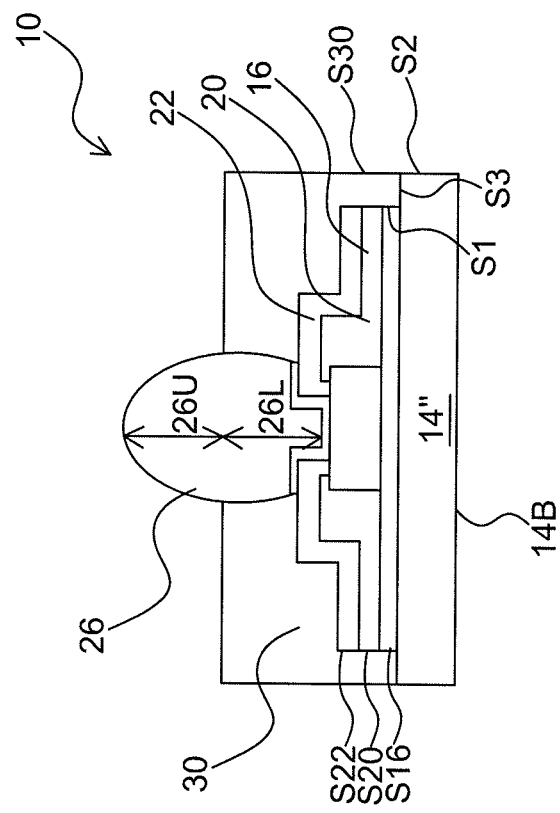

FIGS. 13~15 are schematic diagrams illustrating a method of manufacturing a semiconductor package according to an embodiment. Unless specified otherwise, the reference numerals in these embodiments represent like elements in the embodiments illustrated in FIGS. 1-6.

With reference to FIG. 13, a grooving process is performed on the wafer 100 to form a groove 28c on the scribe line region 12. The grooving process removes portions of the second passivation layer 22, the first passivation layer 20 and the dielectric layer 16 within the scribe line regions 12, and the surface of the semiconductor substrate 14 is exposed. In an embodiment, the groove 28c of a width W1 penetrates the layers 22, 20 and 16. The width W1 is less than the width W2 of the scribe line region 12.

Next, as shown in FIG. 14, a molding compound layer 30 is applied on the resulted structure to cover the second passivation layer 22 and fill the groove 28c, where each bump 26 is partially buried in the molding compound layer 30. In an embodiment, the molding compound layer 30 is in physical contact with a lower portion 26L of the bump 26, while the upper portion 26U of the bump 26 is exposed and protrudes from a top surface 30A of the molding compound layer 30. In some embodiments, the molding compound layer 30 may be in physical contact with the second passivation layer 22 and/ or the UBM layers 24.

After thinning process and singulation process, the individual chip 10 is shown as FIG. 15. The molding compound layer 30 covers the lower portion 26L of the bump 26, the surface of the second passivation layer 22, and the sidewalls S22, S20 and S16 of the layers 22, 20 and 16. In addition, in the individual chip 10, the sidewall S2 of the thinned substrate 14" is substantially leveled with the sidewall S30 of the molding compound layer 30.

According to the embodiments, a semiconductor package includes a passivation layer overlying a semiconductor substrate, a bump overlying the passivation layer, and a molding compound layer overlying the passivation layer and covering a lower portion of the bump. A sidewall of the passivation layer is covered by the molding compound layer.

According to some embodiments, a method of forming a semiconductor package includes forming a passivation layer overlying a semiconductor substrate which includes a first chip region, a second chip region and a scribe line region positioned between the first chip region and the second chip region. A bump is then formed overlying the passivation layer on at least one of the first chip region and the second chip region. Next, a groove is formed to pass through the passivation layer on the scribe line region. Then a molding compound layer is formed to cover the passivation layer and a lower portion of the bump and fill the groove. After performing a singulation process on the scribe line region, the first chip region is separated from the second chip region.

According to some embodiments, a semiconductor package includes a dielectric layer overlying a substrate, a contact pad overlying the dielectric layer, a passivation layer overlying the contact pad, a bump overlying the passivation layer, and a molding compound layer overlying the passivation layer and covering a lower portion of the bump. The sidewalls of the passivation layer and the dielectric layer are covered by the molding compound layer.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A semiconductor package, comprising:
    a chip comprising:
        a semiconductor substrate having a thickness, the semiconductor substrate comprising a recessed region, the recessed region comprising:
            an upper portion having a first width and a first depth with respect to an upper surface of the semiconductor substrate, the first depth terminating at an upper recess portion surface substantially parallel to the upper surface of the semiconductor substrate; and
            a lower portion defined by the upper recess portion surface and a lower recess portion surface substantially parallel to the upper surface of the semiconductor substrate, wherein the lower portion has a second width and a second depth with respect to the upper surface of the semiconductor substrate, the second depth is greater than the first depth and less than the thickness of the semiconductor substrate, and the second depth terminates at the lower recess portion surface;
        a passivation layer overlying the semiconductor substrate; and
        a bump overlying the passivation layer; and
    a molding compound layer overlying the passivation layer and covering a lower portion of the bump;
    wherein a sidewall of the passivation layer is covered by the molding compound layer, the lower portion of the recessed region is entirely filled with the molding compound layer, and the upper portion of the recessed region is entirely filled with the molding compound layer.

2. The semiconductor package of claim 1, wherein the semiconductor substrate comprises
    an upper sidewall adjacent to the sidewall of the passivation layer,
    a lower sidewall closer to a backside of the semiconductor substrate than the upper sidewall; and
    a surface region extending from the upper sidewall to the lower sidewall, and the upper sidewall and the surface region form at least a portion of the recessed region in the semiconductor substrate.

3. The semiconductor package of claim 2, wherein the molding compound layer covers the upper sidewall and the surface region of the semiconductor substrate.

4. The semiconductor package of claim 2, wherein a sidewall of the semiconductor substrate is substantially leveled with a sidewall of the molding compound layer.

5. The semiconductor package of claim 2, wherein the upper sidewall of the semiconductor substrate is substantially leveled with the sidewall of the passivation layer.

6. The semiconductor package of claim 2, wherein the molding compound layer covers the lower sidewall of the semiconductor substrate.

7. The semiconductor package of claim 1, wherein an upper portion of the bump protrudes from a top surface of the molding compound layer.

8. A semiconductor package, comprising:
a chip comprising:
a semiconductor substrate having a thickness, the semiconductor substrate comprising a recessed region, the recessed region comprising:
an upper portion having a first width and a first depth with respect to an upper surface of the semiconductor substrate, the first depth terminating at an upper recess portion surface substantially parallel to the upper surface of the semiconductor substrate; and
a lower portion defined by the upper recess portion surface and a lower recess portion surface substantially parallel to the upper surface of the semiconductor substrate, wherein the lower portion has a second width and a second depth with respect to the upper surface of the semiconductor substrate, the second depth is greater than the first depth and less than the thickness of the semiconductor substrate, and the second depth terminates at the lower recess portion surface;
a dielectric layer overlying the semiconductor substrate;
a contact pad overlying the dielectric layer;
a passivation layer overlying the contact pad; and
a bump overlying the passivation layer; and
a molding compound layer overlying the passivation layer and covering a lower portion of the bump;
wherein sidewalls of the passivation layer and the dielectric layer are covered by the molding compound layer, the lower portion of the recessed region is entirely filled with the molding compound layer, and the upper portion of the recessed region is entirely filled with the molding compound layer.

9. The semiconductor package of claim 8, wherein the semiconductor substrate comprises
an upper sidewall adjacent to the sidewall of the dielectric layer,
a lower sidewall closer to a backside of the semiconductor substrate than the upper sidewall; and
a surface region extending from the upper sidewall to the lower sidewall, and the upper sidewall and the surface region are covered by the molding compound layer.

10. The semiconductor package of claim 9, wherein the upper sidewall and the surface region form at least a portion of the recessed region in the semiconductor substrate.

11. The semiconductor package of claim 9, wherein the upper sidewall of the semiconductor substrate is substantially leveled with the sidewall of the dielectric layer.

12. The semiconductor package of claim 9, wherein the molding compound layer covers the lower sidewall of the semiconductor substrate.

13. The semiconductor package of claim 8, wherein a sidewall of the semiconductor substrate is substantially leveled with a sidewall of the molding compound layer.

14. A semiconductor package, comprising:
a chip comprising:
a semiconductor substrate having a thickness, the semiconductor substrate comprising a recess, the recess comprising:
an upper portion having a first width and a first depth with respect to an upper surface of the semiconductor substrate, the first depth terminating at an upper recess portion surface substantially parallel to the upper surface of the semiconductor substrate; and
a lower portion defined by the upper recess portion surface and a lower recess portion surface substantially parallel to the upper surface of the semiconductor substrate, wherein the lower portion has a second width and a second depth with respect to the upper surface of the semiconductor substrate, the second depth is greater than the first depth and less than the thickness of the semiconductor substrate, and the second depth terminates at the lower recess portion surface;
a passivation layer overlying the semiconductor substrate; and
a bump overlying the passivation layer; and
a molding compound layer overlying the passivation layer, wherein a sidewall of the passivation layer is covered by the molding compound layer, the lower portion of the recess is entirely filled with the molding compound layer, and the upper portion of the recess is entirely filled with the molding compound layer.

15. The semiconductor package of claim 14, wherein the first depth of the upper portion is greater than 10 microns ($\mu$m).

16. The semiconductor package of claim 14, further comprising a dielectric layer formed between the passivation layer and the semiconductor substrate, wherein the molding compound layer covers a sidewall of the dielectric layer.

17. The semiconductor package of claim 14, wherein the first width is larger than the second width.

18. The semiconductor package of claim 14, wherein the bump comprises:
a lower portion; and
an upper portion distal from the passivation layer,
wherein the upper portion is exposed by the molding compound layer.

19. The semiconductor package of claim 14, wherein the recess comprises upper sidewalls corresponding to the upper portion of the recess and lower sidewalls corresponding to the lower portion of the recess, and the molding compound layer covers the upper sidewalls and the lower sidewalls.

* * * * *